(12) United States Patent  (10) Patent No.: US 8,710,585 B1
Hu et al.  (45) Date of Patent: Apr. 29, 2014

(54) HIGH VOLTAGE FAST RECOVERY TRENCH DIODE

(71) Applicants: Jun Hu, San Bruno, CA (US); Karthik Padmanabhan, Longwood, FL (US); Madhur Bobde, Sunnyvale, CA (US); Hamza Yilmaz, Saratoga, CA (US)

(72) Inventors: Jun Hu, San Bruno, CA (US); Karthik Padmanabhan, Longwood, FL (US); Madhur Bobde, Sunnyvale, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/776,497

(22) Filed: Feb. 25, 2013

(51) Int. Cl.
*H01L 29/66* (2006.01)

(52) U.S. Cl.
USPC ........... 257/330; 257/490; 257/594; 438/237; 438/589

(58) Field of Classification Search
USPC ................... 257/330, 490, 594; 438/237, 589
See application file for complete search history.

(56) References Cited

U.S. PATENT DOCUMENTS

| 4,982,244 | A | 1/1991 | Kapoor | |
|---|---|---|---|---|
| 7,427,800 | B2 * | 9/2008 | Yilmaz | 257/488 |
| 8,350,317 | B2 * | 1/2013 | Kocon | 257/328 |
| 2005/0167742 | A1 | 8/2005 | Challa et al. | |
| 2012/0193676 | A1 * | 8/2012 | Bobde et al. | 257/140 |
| 2012/0228700 | A1 * | 9/2012 | Nishii et al. | 257/330 |

* cited by examiner

*Primary Examiner* — Trung Q Dang
(74) *Attorney, Agent, or Firm* — Joshua D. Isenberg; JDI Patent (57) ABSTRACT

Aspects of the present disclosure describe high voltage fast recovery trench diodes and methods for make the same. The device may have trenches that extend at least through a top P-layer and an N-barrier layer. A conductive material may be disposed in the trenches with a dielectric material lining the trenches between the conductive material and sidewalls of the trenches. A highly doped P-pocket may be formed in an upper portion of the top P-layer between the trenches. A floating N-pocket may be formed directly underneath the P-pocket. The floating N-pocket may be as wide as or wider than the P-pocket. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

21 Claims, 10 Drawing Sheets

HIGH VOLTAGE FAST RECOVERY TRENCH DIODE

FIELD OF THE INVENTION

This invention generally relates to semiconductor diodes. Specifically, the invention is directed to high voltage trench based diodes.

BACKGROUND OF THE INVENTION

Figure 1A:
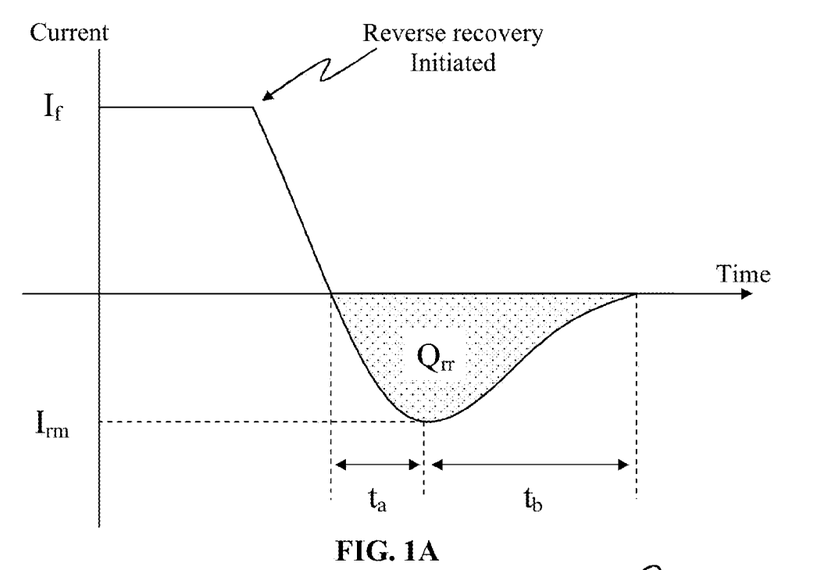
FIG. 1A is a graph of the reverse recovery behavior of a diode.

The reverse recovery behavior of a diode is shown in the graph presented in FIG. 1A. Initially, the diode is conducting current in the forward direction. Once the reverse recovery is initiated, the forward current begins to decrease, and ultimately begins flowing in the reverse direction. The reverse current increases during the time $t_a$ until it reaches the maximum reverse recovery current $I_{rm}$. Thereafter, during the period of time $t_b$ the reverse current decreases until it returns to approximately zero. At this point the diode is able to block the reverse flow of current. The reverse current flow during $t_a$ and $t_b$ allows the diode to remove the charge that has built up in the device while it is turned on in the forward state. The total amount of charge that needs to be removed (the reverse recovery charge $Q_{rr}$ is the shaded area under the curve. Therefore, in order to decrease the recovery time it is desirable to decrease both the value of $I_{rm}$, and $Q_{rr}$. However, if the reverse current falls too sharply towards the end of the reverse recovery period, stray circuit inductance may cause an increased voltage across the device. The softness value, S, is a measure of $t_b/t_a$, and is useful in determining if the stray circuit inductance will be too large. Typically, devices with a softness value greater than 1.0 will not have problems with stray circuit inductance causing harm to the device during the reverse recovery.

The $Q_{rr}$ of a diode is largely controlled by the injection efficiency of the device. A diode with a high injection efficiency will generally have a higher $Q_{rr}$. Prior art attempts to reduce the $Q_{rr}$ have therefore focused on reducing the injection efficiency. The injection efficiency may be reduced by decreasing the carrier lifetime in the diode. Specifically, this may be accomplished by processing steps such as, electron radiation, proton radiation, helium irradiation and/or gold or platinum diffusion into the silicon of the diode. However, these processes also lead to increased leakage current in the diode and degraded reverse recovery performance at high temperature.

Figure 1B:
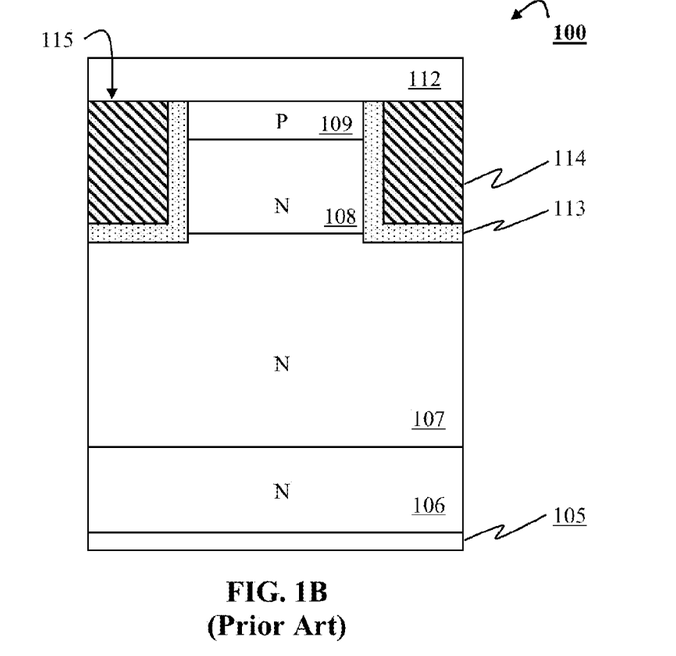
FIG. 1B is a prior art trench diode device.

U.S. patent application Ser. No. 12/931,429, filed Jan. 31, 2011 (U.S. Patent Application Publication No. 2012193676A1) and incorporated herein in its entirety, describes several alternative techniques for reducing the injection efficiency. An example of such a diode is shown in FIG. 1B. First, the top P-layer 109 is lightly doped. The light doping reduces the injection efficiency from the top side of the device because there are fewer charge carriers available. The injection efficiency from the top side may be further reduced by adding a highly doped N-barrier layer 108 immediately below the top P-layer 109. Additionally, the injection efficiency from the bottom of the device is reduced by removing the semiconductor substrate from the device. By way of example, the semiconductor substrate may be removed by back grinding. However, the extent to which the doping concentration of the top P-layer 109 is reduced is limited by the punch through constraint and the quality of the ohmic contact between the contact metal 112 and the upper P-layer 109. Therefore, there is a need in the art to improve the reverse recovery performance by lowering the injection efficiency while still maintaining a good ohmic contact to the upper P-layer 109 and a low leakage current.

It is within this context that embodiments of the present invention arise.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, devices with an N-type epitaxial layer and a P-type top layer are described for purposes of illustration. Substantially similar devices may be fabricated using a similar process but with opposite conductivity types.

Aspects of the present disclosure describe high voltage fast recovery trench diodes and methods for making the same. The device may have trenches that extend at least through a top P-layer and an N-barrier layer. The N-barrier layer may have a higher doping concentration than the N-drift layer. A conductive material is disposed in the trenches with a dielectric material lining the trenches between the conductive material and sidewalls of the trenches. A highly doped P-pocket may be formed between each pair of trenches in an upper portion of the top P-layer. A floating N-pocket may be formed directly underneath the P-pocket. The floating N-pocket may be as wide as or wider than the P-pocket.

The P-pocket and N-pocket may be formed with ion implantation. Aspects of the present disclosure may include forming both the N and P-pockets with a single mask. By way of example, a single mask may be used when the N-pocket is formed with an ion implantation that is oriented perpendicular to the top surface device or an angled ion implantation, and the P-pocket is formed with an ion implantation that is oriented perpendicular to the top surface device with lower implantation energy.

Aspects of the present disclosure include device layouts where the N and P-pockets are centered between two trenches. Devices with N and P-pockets centered between two trenches may include N and P-pockets that are continuous stripes that run parallel to the trenches, or discrete islands that are formed between the trenches. Additional aspects may include device layouts where the N and P-pockets are formed proximate to the trenches. Yet additional aspects of the present disclosure describe N and P-pockets that intersect with the trenches. By way of example, the N and P-pockets may extend across the mesa between trenches and intersect with the trenches at right angles. Yet additional aspects of the present disclosure describe closed cell device layouts. By way of example, and not by way of limitation, the closed cell device layouts may include trenches that intersect to form square shaped closed cells or hexagonal shaped closed cells.

Figure 2A:
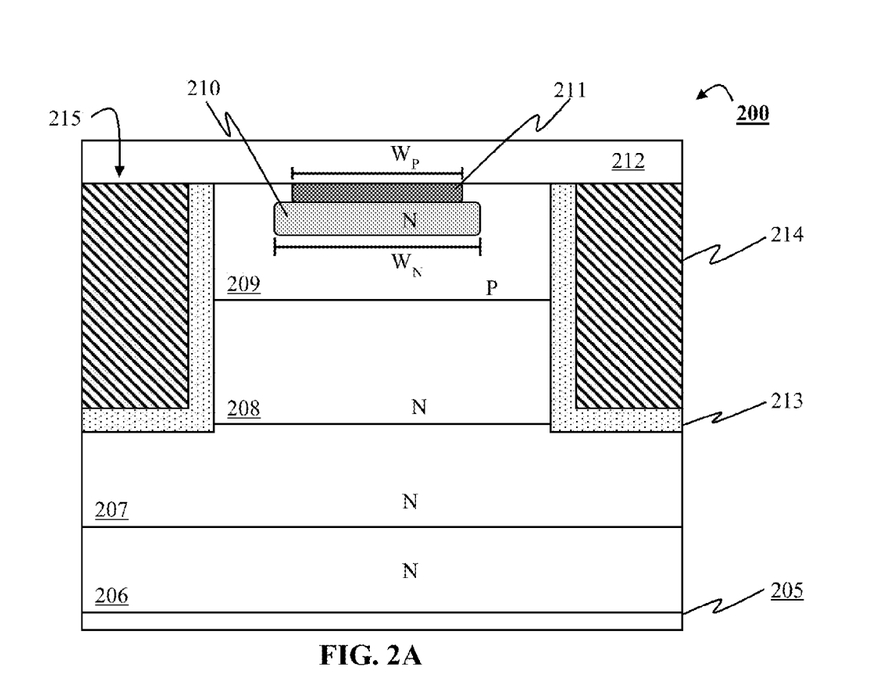
FIGS. 2A-2B are cross-sectional views of trench diodes with N and P-pockets according to aspects of the present disclosure.

FIG. 2A is a cross-sectional drawing of a high voltage fast recovery trench diode 200 according to an aspect of the present disclosure. Diode 200 may be formed in epitaxially grown semiconductor material. A first layer of the epitaxially grown layer may be a heavily N-doped buffer layer 206. By way of example, and not by way of limitation, the buffer layer 206 may have a doping concentration between approximately $1e^{15}$ cm$^{-3}$ and $1e^{16}$ cm$^{-3}$. An N-doped drift region 207 may be formed above the buffer layer 206. By way of example and not by way of limitation, the drift region 207 may have a doping concentration between approximately $1e^{13}$ cm$^{-3}$ and $1e^{14}$ cm$^{-3}$. A heavily doped barrier layer 208 may be formed above the drift region 207. By way of example, and not by way of limitation, the barrier layer 208 may have a doping concentration between approximately $1e^{15}$ cm$^{-3}$ and $1e^{16}$ cm$^{-3}$. Finally, above the barrier layer 208 is a top P-layer 209. The doping concentration of the top P-layer should be minimized in order to reduce the injection efficiency of the device. By way of example, and not by way of limitation, the top P-layer may have a doping concentration between approximately $1e^{15}$ cm$^{-3}$ and $1e^{16}$ cm$^{-3}$. The doping concentration of the top P-layer 209 and the doping concentration of the barrier layer 208 should preferably be configured such that the total N-charges and P-charges balance each other out, because balancing the charges reduces the injection efficiency of the device. By way of example, and not by way of limitation, the N-type dopants may be phosphorus, arsenic, or antimony, and the P-type dopants may be boron or $BF_2$.

One or more trenches 215 may be formed through the top P-layer 209 and the barrier layer 208. The trenches 215 should extend to a depth that is at least as deep as the barrier layer 208 and may optionally extend into the epitaxial layer 207. Each trench may be lined with a dielectric trench lining material 213, such as, but not limited to, silicon dioxide. The remaining portions of each trench may be filled with a conductive material 214, such as, but not limited to, polysilicon. In order to improve the ohmic contact of the device, a highly doped P-pocket 211 with a width $W_P$ may be formed at the top surface of the top P-layer 209. The doping concentration of the P-pocket 211 is higher than the doping concentration of the top P-layer in order to produce an improved ohmic contact with the contact metal 212. By way of example, and not by way of limitation, the doping concentration of the P-pocket 211 may be between approximately $1e^{18}$ cm$^{-3}$ and $1e^{19}$ cm$^{-3}$. By way of example, and not by way of limitation, the dopants used to form the P-pocket 211 may be boron or $BF_2$.

The high doping concentration of the P-pocket 211 provides additional charge carriers that tend to increase the injection efficiency of the device 200. Therefore, an electrically floating N-pocket 210 with a width $W_N$ is formed below the P-pocket 211 in order to prevent the increase in the injection efficiency. The width $W_N$ of the N-pocket 210 may be equal to or greater than the width $W_P$ of the P-pocket 211. Having a width $W_N$ that is at least equal to the width $W_P$ of the P-pocket 211 ensures that the N-Pocket 210 will shield the entire P-pocket 211 and will prevent the additional charge carriers from being injected into the device. By way of example, the N-pocket 210 may have a doping concentration between approximately $1e^{17}$ cm$^{-3}$ and $1e^{18}$ cm$^{-3}$. By way of example, and not by way of limitation, the dopants used to form the N-pocket 210 may be phosphorous, arsenic, or antimony.

Figure 3A:
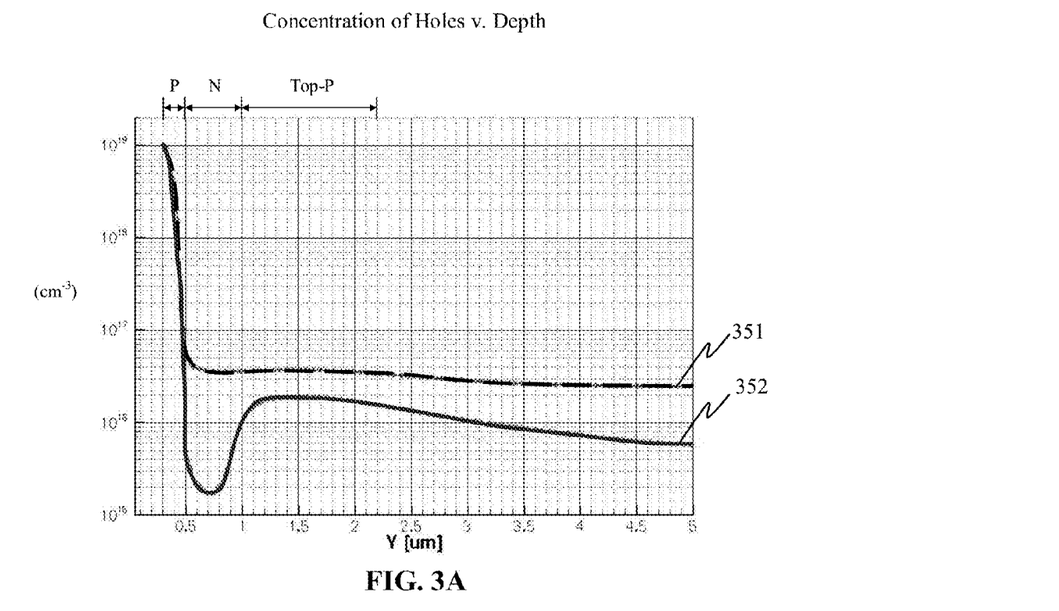
FIG. 3A is a graph comparing the concentration of holes in a trench diode with N and P-pockets according to aspects of the present disclosure with a trench diode described in the prior art.
Figure 3B:
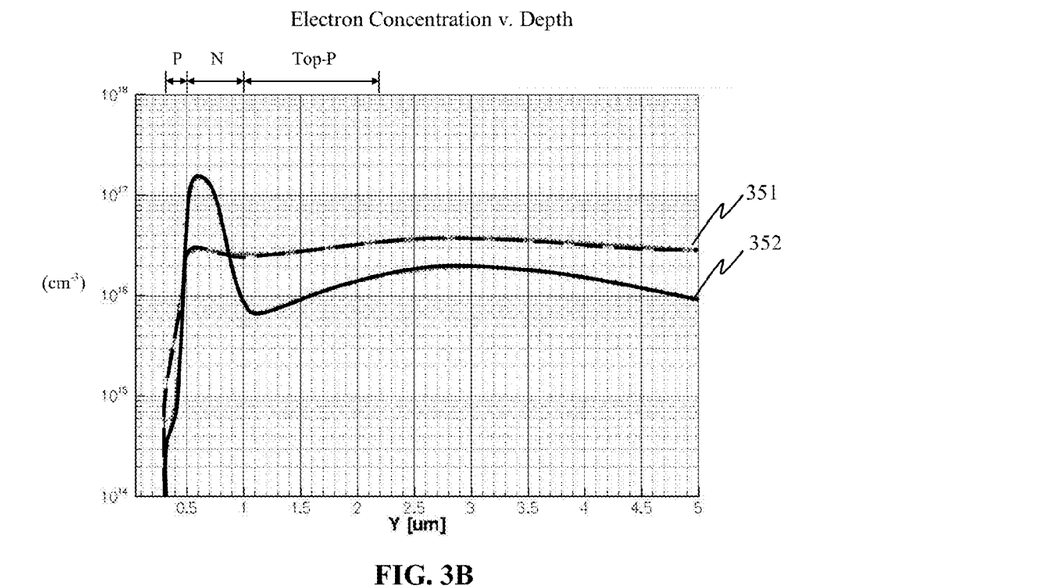
FIG. 3B is a graph comparing the concentration of electrons in a trench diode with N and P-pockets according to aspects of the present disclosure with a trench diode described in the prior art.

The reduction in the injection efficiency of device 200 can be seen in FIGS. 3A-3B. FIGS. 3A-3B show the carrier concentrations at the on state with and without N-pocket implant. At the depths that approximately 1 micron and greater, the carrier concentrations are higher than the doping level because of the conduction modulation. It is desirable to lower the carrier concentrations in this region by reducing the injection efficiency. FIG. 3A is a graph that compares the hole density with respect to depth into the device for devices with and without the N-pocket. The dashed line is a plot of the hole density for a trench diode without an N-pocket 351, and the solid line is a plot of the hole density for a substantially similar trench diode with the addition of an N-pocket 352. As shown in FIG. 3A, the top of the P-pocket is located at approximately 0.25 microns; the top of the N-pocket is located at approximately 0.50 microns; the bottom of the N-pocket is located at approximately 1.0 microns; and the bottom of the top P-layer begins at approximately 2.25 microns. As may be seen from the graph the carrier concentration for the trench diode with the N-pocket 352 is lower than the carrier concentration for the trench diode without the N-pocket 351. In FIG. 3B, the electron density of the same devices are charted. The trench diode without the N-pocket 351 is represented by the dashed line, and the trench diode with the N-pocket 352 is represented by the solid line. With the exception of the N-pocket region, the carrier concentration of the trench diode with the N-pocket 352 has a lower concentration of charge carriers. As such, the value of $Q_{rr}$ for the trench diode 352 with the N-pocket is lower. Additionally, the $I_{rm}$ of the trench diode 352 with the N-pocket is lower than the $I_{rm}$ of the similar trench diode 351 that does not have the N-pocket. Specifically, the trench diode 352 with the N-pocket has an $I_{rm}$ of 3 amps, and the trench diode 351 without the N-Pocket has an $I_{rm}$ of 5 amps. With a lower $Q_{rr}$ and $I_{rm}$ the trench diode 352 will have a faster recovery time.

Returning to FIG. 2A, the contact metal 212 may be formed above the exposed top surface of the device 200. By way of example, and not by way of limitation, the contact metal 212 may be tungsten. The contact metal 212 should preferably make electrical contact with the trench conductive material 214, the P-pocket 211 and the top P-layer 209. The size of the ohmic contact to the P-pocket 211 should be as small as possible while still capable of producing a forward voltage VF that is relatively low. There is a tradeoff between VF and QRR that depends on the device application. In some applications a VF as high as 2.5V may be acceptable in order to switch very fast. Other applications may require a lower VF.

Figure 6A:
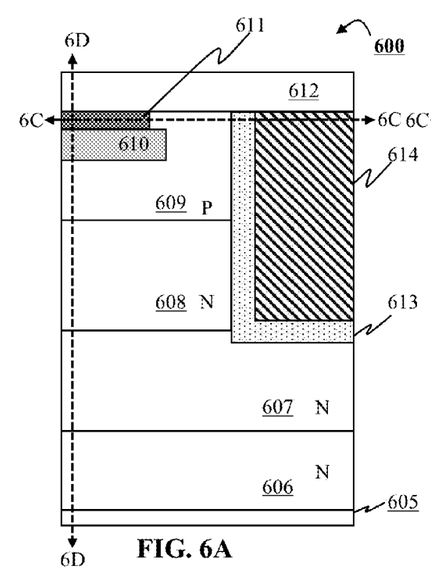
FIGS. 6A and 6B depict trench diodes with N and P-pockets with different contact metal configurations according to aspects of the present disclosure.
Figure 6B:
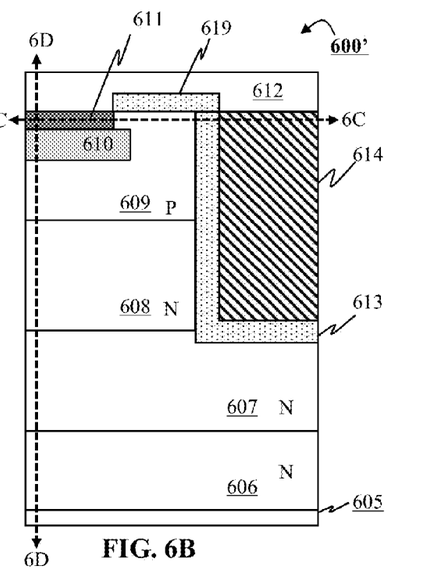
Figure 6C:
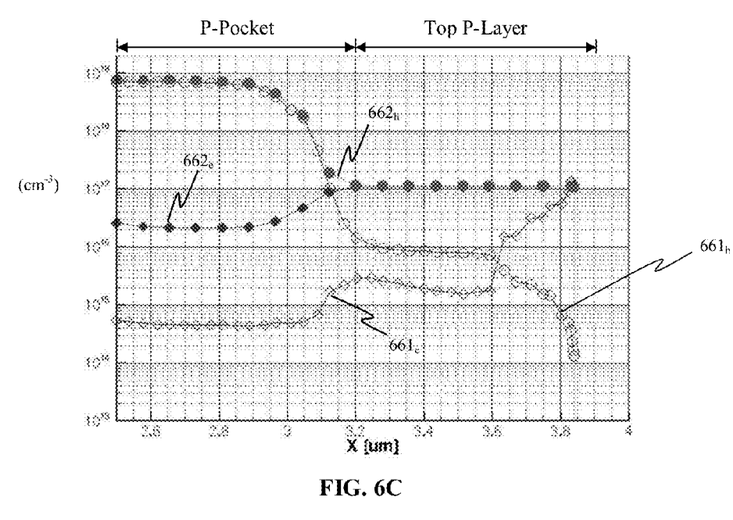
FIGS. 6C and 6D are graphical representations of the carrier concentrations along the lines 6C and 6D in FIGS. 6A and 6B.
Figure 6D:
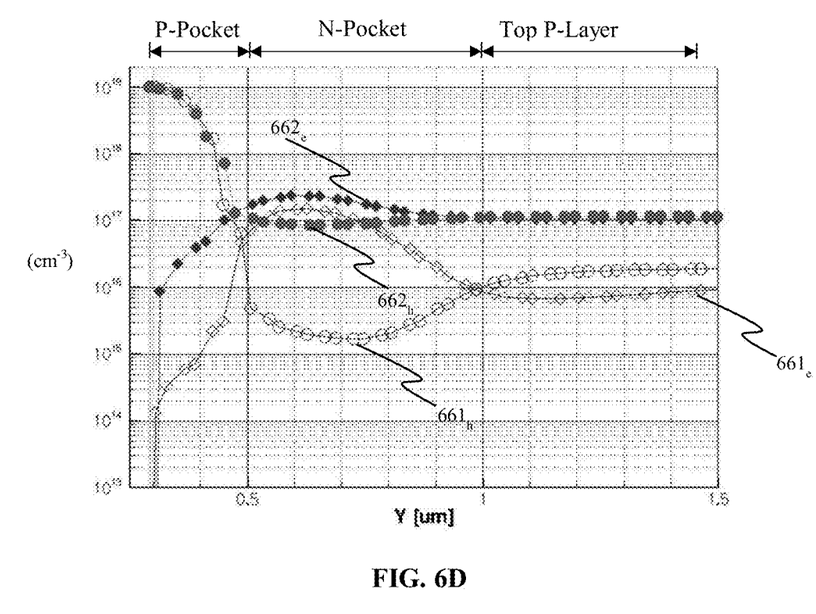

FIGS. 6A-6D illustrate the importance of making contact across all three portions. FIG. 6A depicts a device 600 that is substantially similar to device 200 shown in FIG. 2A, and FIG. 6B depicts a device 600' that is substantially similar to device 600 with the exception that insulating layer 619 prevents the contact layer 612 from making electrical contact with the top P-layer 609. FIGS. 6C and 6D are graphs that compare the carrier concentrations for the trench diode devices 600 and 600'. In FIGS. 6C and 6D, the lines marked with unfilled circles $661_h$ represent the concentration of holes in device 600 and the lines marked with the unfilled diamonds $661_e$ represent the concentration of electrons in device 600. In FIGS. 6C and 6D, the lines marked with solid circles $662_h$ represent the concentration of holes in device 600' and the lines marked with the solid diamonds $662_e$ represent the concentration of electrons in device 600'.

FIG. 6C depicts the carrier concentration that is seen across a slice of each device 600, 600' along the line 6C in FIGS. 6A and 6B. In both devices the far right edge of the P-pocket 611 is located at approximately 3.2 microns along the X-axis and the far right edge of the top P-layer 609 is located at about 3.8 microns along the X-axis as depicted in FIG. 6C. As may be seen, the carrier concentrations for the device 600 are lower than those of the device 600'. FIG. 6D depicts the carrier concentration that is seen across a slice of each device 600, 600' along the line 6D in FIGS. 6A and 6B. With respect the X-axis shown in FIG. 6D, the top of the P-pocket 611 is located at approximately 0.3 microns, and the bottom of the P-pocket 611 is located at approximately 0.5 microns. The bottom of the N-pocket 610 is located at approximately 1.0 microns. As may be seen, the carrier concentrations for the device 600 are lower than those of the device 600'. The lower carrier concentrations across both the line 6C and 6D create a diode that has a much lower $I_{rm}$ (the $I_{rm}$ for device 600 is approximately 20% of the $I_{rm}$ for device 600'). Additionally, the value of $Q_{rr}$ for device 600 is an order of magnitude smaller than that for device 600'. Specifically, device 600' has a $Q_{rr}$ that is approximately 15 times larger than that of the $Q_{rr}$ for device 600. The large decrease in the $Q_{rr}$ and $I_{rm}$ allow for a faster recover time.

Figure 3C:
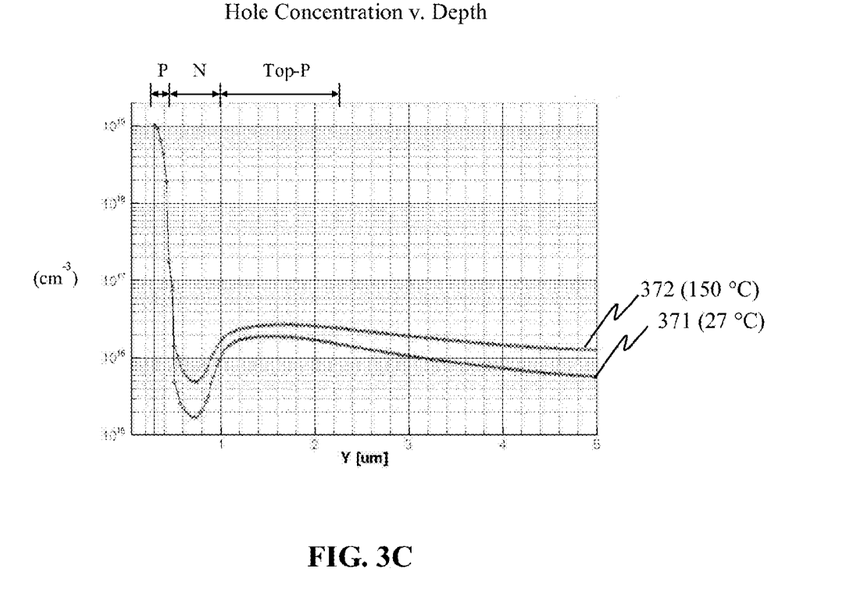
FIG. 3C is a graph comparing the effect of temperature on the concentration of holes in a trench diode with N and P-pockets according to aspects of the present disclosure.
Figure 3D:
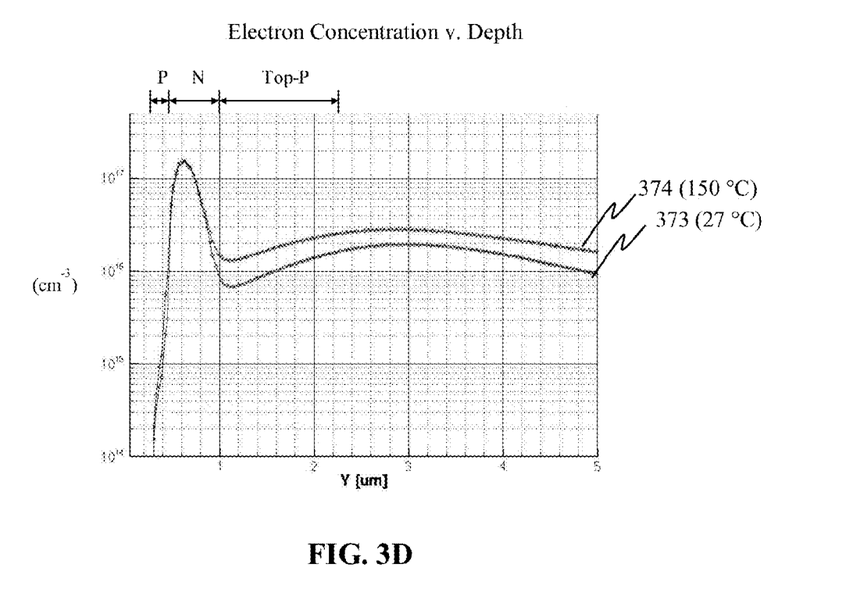
FIG. 3D is a graph comparing the effect of temperature on the concentration of electrons in a trench diode with N and P-pockets according to aspects of the present disclosure.

High voltage fast recovery trench diodes according to aspects of the present disclosure also perform well at elevated temperatures. FIG. 3C depicts the concentration of holes in device 200 at 27° C. with line 371 and the concentration of holes in device 200 at 150° C. with line 372. Similarly, in FIG. 3D the electron concentration of device 200 at 27° C. is shown with line 373 and the electron concentration of device 200 at 150° C. is shown with line 374. While there is a slight increase in the concentration of charge carriers, it does not greatly alter the $I_{rm}$ or the $Q_{rr}$. Specifically, the $I_{rm}$ of device 200 increases by approximately 20% when the temperature is increased from 27° C. to 150° C., and the $Q_{rr}$ of device 200 increases approximately 10% under a similar increase in temperature. Further, the increase in temperature may increase the softness value S, but it will not drop below 1.0. By way of example, device 200 has a softness of 2.44 at 27° C. and a softness of 1.36 at 150° C. Additionally, the increase in temperature also increases the value VF of the device from 2.8 V to 4.0 V. This indicates the temperature coefficient is positive, which is critical for parallel switching applications.

Figure 2B:
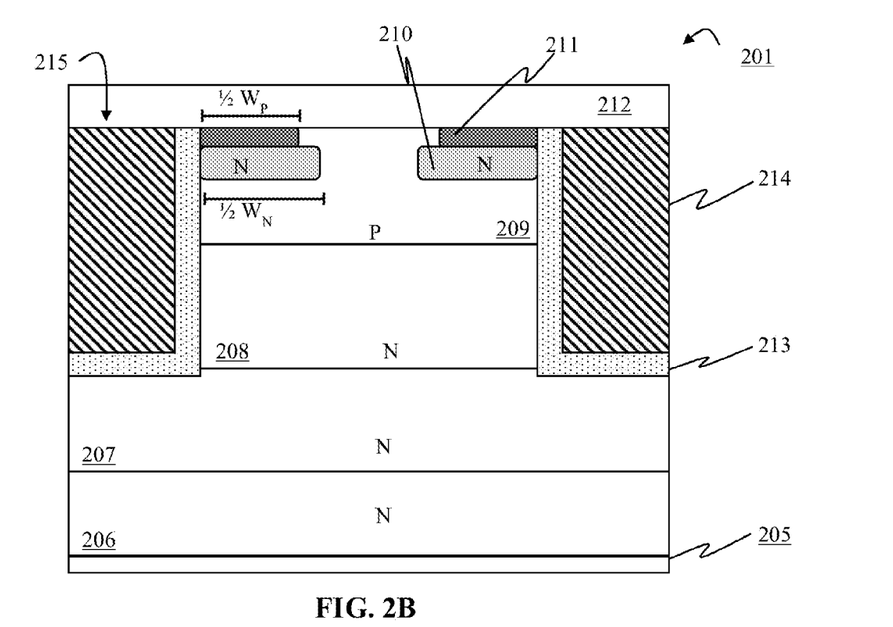

FIG. 2B depicts a high voltage fast recovery diode according to an additional aspect of the present disclosure. Device 201 shown in FIG. 2B is substantially similar to the device 200 shown in FIG. 2A, with the exception of the location of the N-pocket 210 and the P-pocket 211. Instead of forming the pockets 210 and 211 centered between two trenches 215, the pockets are formed proximate to the trenches 215. The N-pocket 210 may be formed with a width $\frac{1}{2} W_N$ that is equal to or greater than the width $\frac{1}{2} W_P$ of the P-pocket 211.

Aspects of the present disclosure describe methods for fabricating high voltage fast recover trench diodes according to aspects of the present disclosure. The methods of fabrication are described in conjunction with FIGS. 4A-4E which depict cross sectional views of a device structure 400 at different stages of fabrication.

Figure 4A:
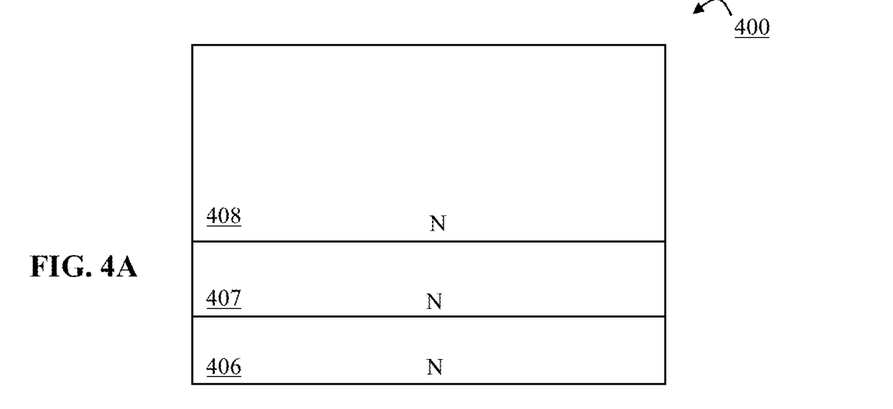
FIGS. 4A-4E describe a process for forming a trench diode with N and P-pockets according to aspects of the present disclosure.

In FIG. 4A device 400 has three epitaxially grown layers 406, 407, and 408. The epitaxially grown layers may be grown on a semiconductor substrate (not shown). The semiconductor substrate may optionally be partially or completely removed. By way of example, and not by way of limitation, the semiconductor substrate may be removed with a back grinding process. The lowest epitaxial layer 406 may be a heavily N-doped buffer layer. By way of example, the buffer layer 406 may have a doping concentration between approximately $1e^{15}$ cm$^{-3}$ and $1e^{16}$ cm$^{-3}$. The epitaxial layer 407 formed above the buffer layer 406 may be an N-doped drift region. By way of example and not by way of limitation, the drift region 407 may have a doping concentration between approximately $1e^{13}$ cm$^{-3}$ and $1e^{14}$ cm$^{-3}$. The upper epitaxial layer 408 may be a heavily N-doped barrier layer. By way of example, and not by way of limitation, the barrier layer 408 may have a doping concentration between approximately $1e^{15}$ cm$^{-3}$ and $1e^{16}$ cm$^{-3}$.

Figure 4B:
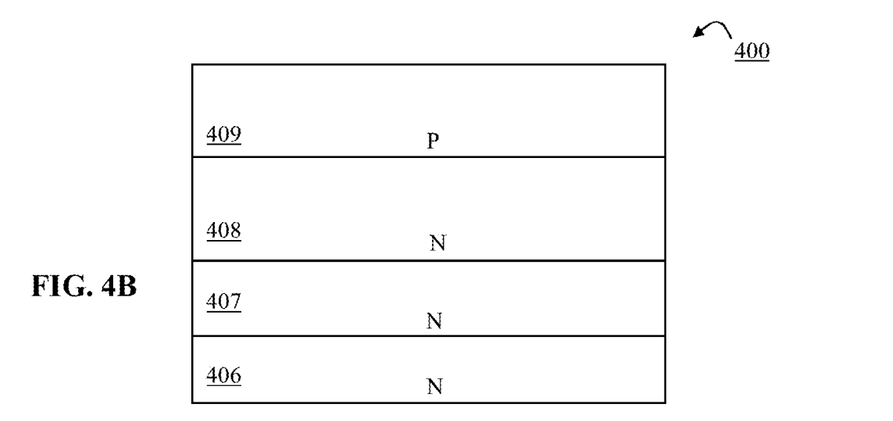

Next, in FIG. 4B a top P-layer 409 may be formed in an upper portion of the barrier layer 408. By way of example, and not by way of limitation, the top P-layer 409 may have a doping concentration between approximately $1e^{15}$ cm$^{-3}$ and $1e^{16}$ cm$^{-3}$. The top P-layer may be formed as an additional epitaxial layer that is grown above the barrier layer 408. When the top P-layer 409 is formed with epitaxial growth, the layer must be formed before trenches 415 are formed in the device 400. Alternatively, the top P-layer 409 may be formed with a blanket implant of P-type dopants. If the top P-layer 409 is formed through implantation, then the implantation step may be performed before or after the trenches 415 are formed in the device 400.

Figure 4C:
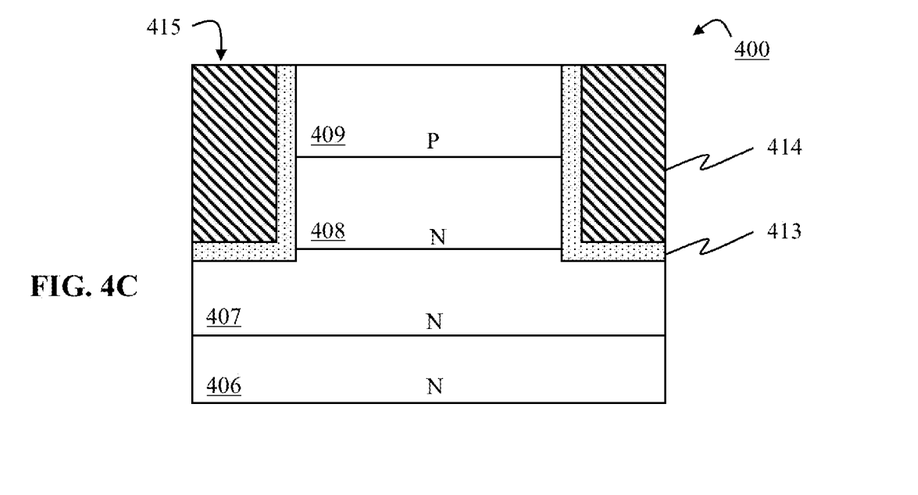

In FIG. 4C a trench mask may be used to form the one or more trenches 415 in the device 400. The trenches 415 should extend to a depth that is equal to or below the depth of the bottom surface of the barrier layer 408. The trenches 415 may then be lined with a dielectric trench lining material 413. By way of example, and not by way of limitation, the trenches may be lined with an oxide. The trenches 415 may then be filled with a conductive material 414, such as a polysilicon.

Figure 4D:
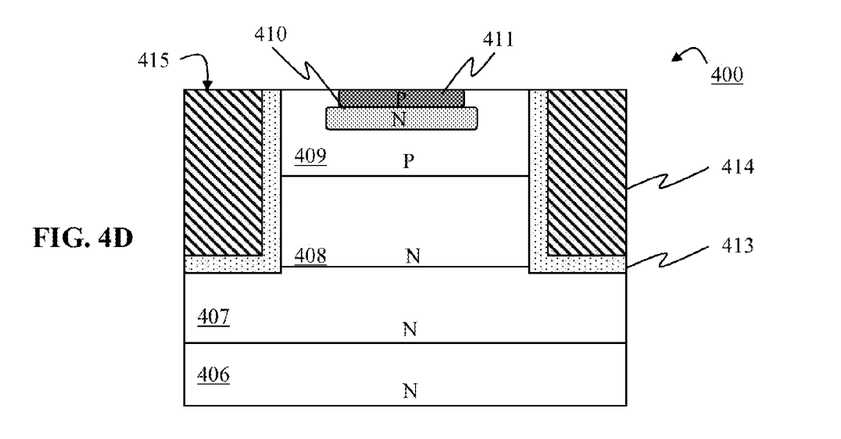

In FIG. 4D a floating N-pocket 410 and a P-pocket 411 may be formed in a top portion of the top P-layer 409. The P-pocket 411 is formed above the N-pocket 410, and the width $W_P$ the P-pocket 411 should be equal to or less than the width $W_N$ of the N-pocket 410. Additionally, the top surface of the P-pocket 411 may be coplanar with the top surface of the top P-layer 409. By way of example, the N-pocket 410 may have a doping concentration between approximately $1e^{17}$ cm$^{-3}$ and $1e^{18}$ cm$^{-3}$, and the doping concentration of the P-pocket 411 may be between approximately $1e^{18}$ cm$^{-3}$ and $1e^{19}$ cm$^{-3}$.

According to certain aspects of the present disclosure, the formation of the two pockets 410,411 may be formed with one mask. In the one mask approach, the N-pocket 410 may be formed with a high energy vertical ion implantation of N-type dopants. The P-pocket 411 may be formed with a low energy vertical ion implantation using the same mask. In this case, the N-Pocket width $W_N$ is almost equal to the P-pocket width $W_P$. To further control the injection efficiency, The N-pocket 410 may be formed with an angled ion implantation of N-type dopants. Implanting the N-dopants at an angle allows the N-pocket width $W_N$ is slightly wider than the P-pocket width $W_P$. The P-pocket 411 may be formed using the same mask and a vertical ion implantation. The P-pocket 411 will therefore be limited to the region of the top P-layer that is left uncovered by the mask. Alternatively, the N-pocket 410 may be formed with a vertical ion implantation, and then followed by a diffusion step. The N-type dopants will diffuse and expand the width $W_N$ of the N-pocket 410. Thereafter, the P-pocket 411 may be formed with a vertical ion implantation process using the same mask.

Alternative aspects of the present disclosure may utilize two masks for the formation of the N-pocket 410 and the P-pocket 411. A vertical ion implantation of N-type dopants, in conjunction with a first mask, may be used to form the N-Pocket 410. A second mask may be used in conjunction with a vertical ion implantation of P-type dopants in order to form the P-pocket 411. The second mask may have openings that are smaller than that of the first mask, thereby ensuring that the width of the N-pocket is larger than that of the P-pocket.

Figure 4E:
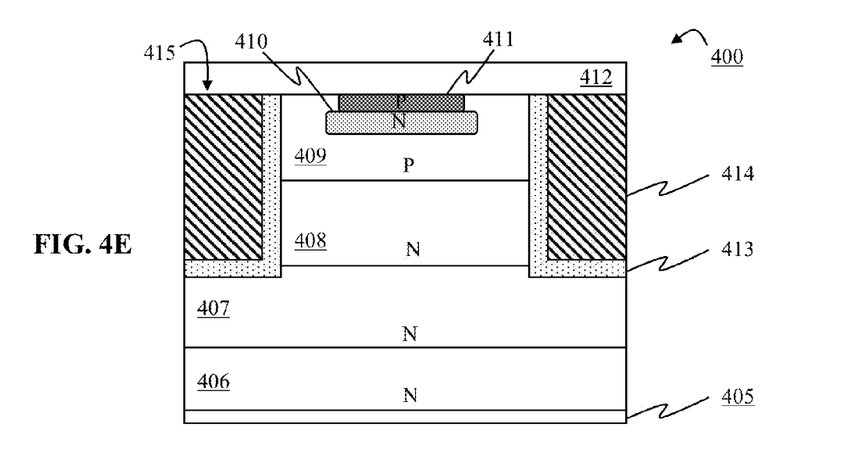

After the formation of the N-pocket 410 and the P-pocket 411, a conductive contact layer 412 may be formed over the top surfaces of device 400. The conductive contact layer should make contact with the conductive material 414, the top P-layer 409, and the P-pocket 411. Additionally, a bottom contact 405 may be formed on the bottom surface of the buffer layer 406.

FIGS. 5A-5F depict aspects of the present disclosure from an overhead view, looking down on the top surface of the trench diode with the conductive contact layer removed. The lines indicating the boarder of the N-pockets 511 in each of the overhead views are dashed in order to indicate that the N-pockets 511 are formed below the top surface of the device.

Figure 5A:
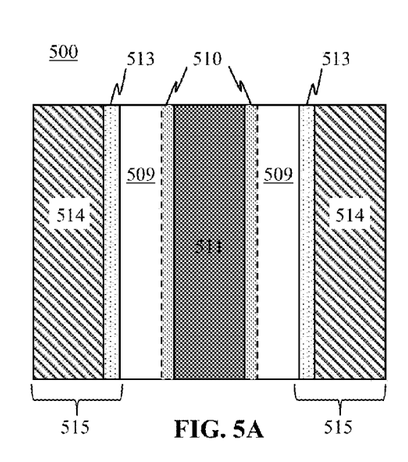
FIGS. 5A-5F are overhead views of the various device layouts for trench diodes with N and P-pockets according to aspects of the present disclosure.

FIG. 5A is an overhead view of a device 500 that is substantially similar to device 200 depicted in FIG. 2A. As may be seen, the N-pocket 510 has a width wider than that of the P-pocket 511. Additionally, both pockets may be continuous stripes that run parallel to the trenches 515.

Figure 5B:
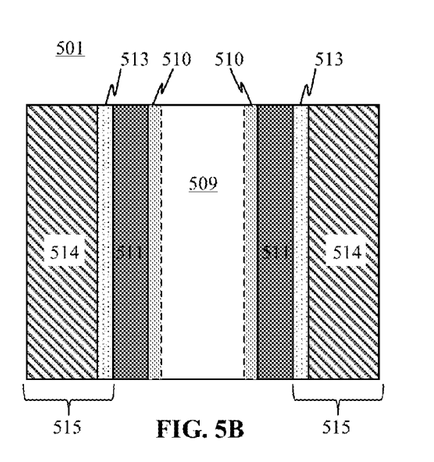

FIG. 5B is an overhead view of a device 501 that is substantially similar to device 201 depicted in FIG. 2B. As shown, there is an N-pocket 510 and a P-pocket 511 adjacent to both trenches 515. Both pockets may be continuous stripes that run parallel to the trenches 515.

Figure 5C:
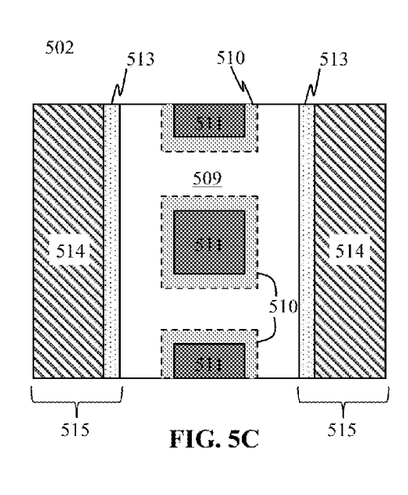

FIG. 5C is an overhead view of a device 502 according to an additional aspect of the present disclosure. Device 502 is substantially similar to device 501 with the except that the P-pockets 511 and the N-pockets 510 are formed as a series of discrete islands instead of being formed as continuous stripes that run parallel to the trenches 512.

Figure 5D:
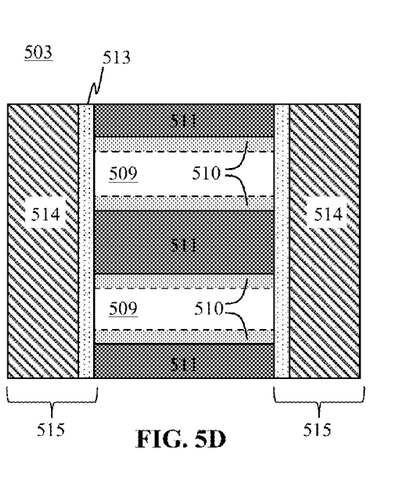

FIG. 5D is an overhead view of a device 503 according to yet another additional aspect of the present disclosure. Device 503 is substantially similar to device 500, except that the P-pockets 511 and the N-pockets 510 are formed as stripes that run perpendicular to the trenches 515. Both the N-Pockets 510 and the P-pockets 511 wave widths that extend across the entire mesa between trenches 515. However, the N-pocket 510 has a length that is equal to or larger than the length of the P-pocket 511.

Figure 5E:
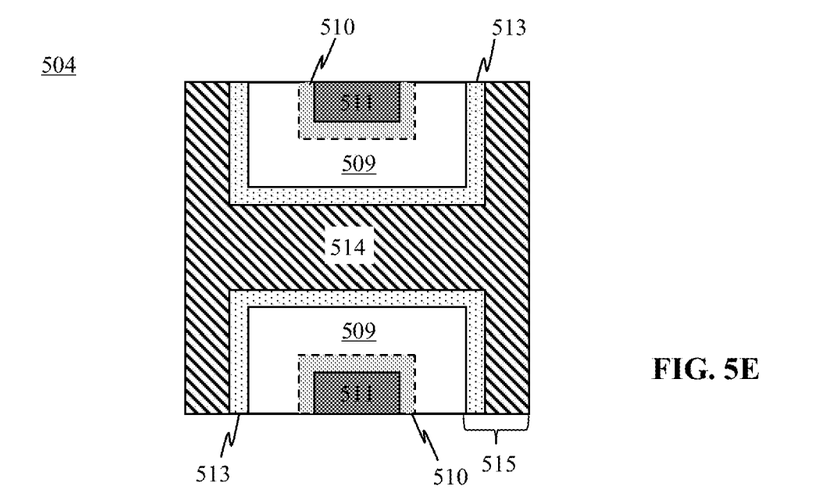
Figure 5F:
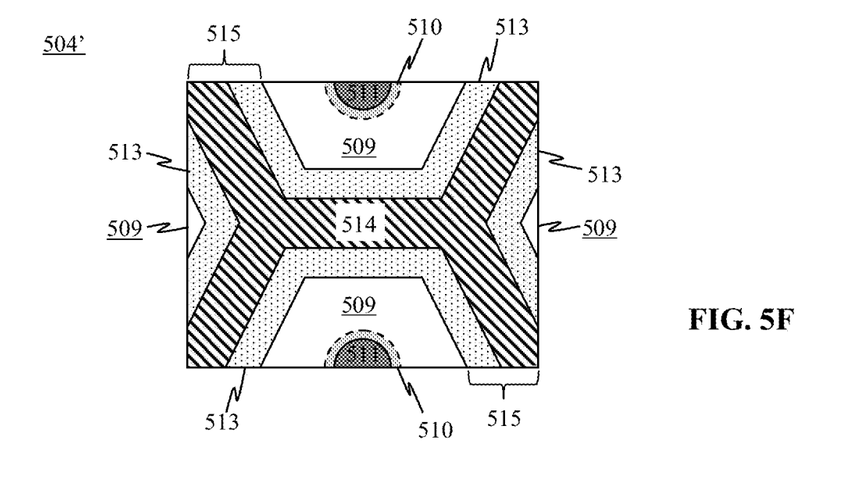

FIGS. 5E-5F depict additional aspects of the present disclosure that describe closed cell structures. In closed cell structures the trenches 515 are configured to intersect with each other at regular intervals. As shown in FIG. 5E, device 504 may have trenches that intersect to form square closed cell structures. According to aspects of the present disclosure, the P-pockets 511 and the N-pockets 510 may be formed as an island at the center of each closed cell. In FIG. 5F, device structure 504' is substantially similar to the device 504, with the exception that the trenches 515 intersect to form hexagonal closed cell structures.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A trench diode comprising:
   an epitaxial layer of a first conductivity type;
   a barrier layer of the first conductivity type formed above the top surface of the epitaxial layer;
   a top-layer of a second conductivity type formed above the top surface of the barrier layer;
   one or more trenches formed through the top-layer and the barrier layer, wherein the a conductive material is disposed in the trenches with a dielectric material lining the trenches between the conductive material and sidewalls of the trenches;
   a contact pocket formed in an upper portion of the top-layer, wherein the contact pocket is of the second conductivity type, and wherein a doping concentration of the contact pocket is greater than a doping concentration of the top-layer;
   an electrically floating pocket formed underneath the contact pocket, wherein the floating pocket is of the first conductivity type; and
   an electrode configured to contact the contact pocket, the top-layer, and the conductive material.

2. The trench diode of claim 1, wherein a doping concentration of the barrier layer is larger than a doping concentration of the epitaxial layer.

3. The trench diode of claim 1, further comprising a buffer layer formed below the bottom surface of the epitaxial layer, wherein the buffer layer is of the first conductivity type.

4. The trench diode of claim 3, wherein an ohmic contact layer is formed on the bottom surface of the buffer layer.

5. The trench diode of claim 1, wherein the contact pocket is separated from one or more of the trenches by a portion of the top-layer.

6. The trench diode of claim 5, wherein the contact pocket extends in a stripe parallel to the one or more trenches.

7. The trench diode of claim 5, wherein the contact pocket is a discrete island formed between two or more trenches.

8. The trench diode of claim 7, wherein the discrete island is formed in the center of one or more trenches that form a closed cell structure.

9. The trench diode of claim 8, wherein the closed cell structure is a square structure.

10. The trench diode of claim 9, wherein the closed cell structure is a hexagonal structure.

11. The trench diode of claim 1, wherein the contact pocket is formed proximate to one of the one or more trenches.

12. The trench diode of claim 11, wherein the contact pocket extends as a stripe parallel to the one or more trenches.

13. The trench diode of claim 11, wherein the contact pocket extends as a stripe perpendicular to the one or more trenches.

14. The trench diode of claim 1, wherein the first conductivity type is N-type, and the second conductivity type is P-type.

15. A method for forming a fast recovery trench diode comprising:
- forming an epitaxial layer of a first conductivity type;
- forming a barrier layer of the first conductivity type above the epitaxial layer, wherein a doping concentration of the barrier layer is greater than a doping concentration of the epitaxial layer;
- forming a top-layer of a second conductivity type above the barrier layer;
- forming one or more trenches that extend at least through the top-layer and the barrier layer
- disposing a conductive material in the one or more trenches with a dielectric material lining the trenches between the conductive material and sidewalls of the trenches;
- forming a contact pocket of the second conductivity type in an upper portion of the top-layer, wherein a doping concentration of the contact pocket is greater than a doping concentration of the top-layer;
- forming an electrically floating pocket of the first conductivity type underneath the contact pocket; and
- forming a conductive contact layer above the top-layer, wherein the contact layer is electrically connected to the contact pocket, the top-layer, and the conductive material.

16. The method of claim 15, wherein the electrically floating pocket has a width $W_F$ and the contact pocket has a width $W_C$, wherein $W_F$ is at least as large as $W_C$.

17. The method of claim 16, wherein $W_F$ is larger than $W_C$.

18. The method of claim 15, wherein the electrically floating pocket is formed with a first mask and the contact pocket is formed with a second mask.

19. The method of claim 15, wherein the electrically floating pocket and the contact pocket are formed with a single mask.

20. The method of claim 19, wherein the electrically floating pocket is formed with an angled ion implantation and the contact pocket is formed with a vertical ion implantation.

21. The method of claim 19, wherein the electrically floating pocket is formed with a vertical ion implantation and the contact pocket is formed with a vertical ion implantation.

* * * * *